US006538867B1

(12) United States Patent
Goodell et al.

(10) Patent No.: US 6,538,867 B1
(45) Date of Patent: Mar. 25, 2003

(54) FET SWITCH WITH OVERVOLTAGE PROTECTION

(75) Inventors: Trenor F. Goodell, Peaks Island, ME (US); Jennifer Richards, Old Orchard Beach, ME (US)

(73) Assignee: Fairchild Semiconductor Corporation, South Portland, ME (US)

( * ) Notice: Subject to any disclaimer, the term of this patent is extended or adjusted under 35 U.S.C. 154(b) by 214 days.

(21) Appl. No.: 09/713,587

(22) Filed: Nov. 15, 2000

(51) Int. Cl.[7] .............................. H02H 3/20; H02H 9/04
(52) U.S. Cl. ......................................... 361/91.1; 361/56
(58) Field of Search ...................... 361/91.1, 56; 326/86, 326/81, 63; 327/534; 307/44, 45

(56) References Cited

U.S. PATENT DOCUMENTS

| | | | | |
|---|---|---|---|---|
| 5,144,165 A | * | 9/1992 | Dhong et al. | 307/451 |
| 5,300,835 A | * | 4/1994 | Assar et al. | 307/475 |
| 5,396,128 A | * | 3/1995 | Dunning et al. | 326/68 |
| 5,914,844 A | * | 6/1999 | Lutley et al. | 361/111 |
| 6,040,711 A | * | 3/2000 | Airansinen et al. | 326/81 |
| 6,377,112 B1 | * | 4/2002 | Rozsypal | 327/534 |

* cited by examiner

Primary Examiner—Brian Sircus
Assistant Examiner—Z Kitov
(74) Attorney, Agent, or Firm—Cesari and McKenna, LLP; Edwin H. Paul, Esq.

(57) ABSTRACT

A bus switch for transferring logic signals between nodes without the problems associated with overvoltage conduction. The bus switch is an FET switch including a single primary transfer transistor. The bulk of the transfer transistor is coupled to an arbitration circuit that establishes a pseudo high-potential power rail. The pseudo high-potential rail is the highest of a potential associated with the first node, the second node, and a standard high-potential supply rail. The arbitration circuit includes regulating diode devices in parallel, one of which passes to the pseudo high-potential rail the potential associated with the first node and the other the potential associated with the second node, whichever is higher. If both are substantial equal to the potential of the standard high-potential rail, that potential is passed to the pseudo high-potential rail.

16 Claims, 4 Drawing Sheets

FET SWITCH WITH OVERVOLTAGE PROTECTION

BACKGROUND OF THE INVENTION

1. Field of the Invention

The present invention relates to electronic switches. In particular, the present invention relates to semiconductor switches, including those formed of one or more metal-oxide-semiconductor (MOS) transistors. More particularly, the present invention relates to P-type MOS (PMOS) field effect transistor (FET) bus switches.

2. Description of the Prior Art

Developments in semiconductor technology have created the capability to produce low-cost, highly reliable switches that are, effectively, implementations of mechanical relays. They have been found to be of particular use, when implemented, as single pole, single throw, type relays, but are not limited thereto. Semiconductor switches are being used more and more as replacements for the prior mechanical relays, due to the high switching speed available as well as their ability to transfer relatively high currents without failure. These switches are often referred to as transfer gates or pass transistors as they employ the characteristics of transistors—usually MOS transistors—to either permit or prevent the passage of a signal.

It is well known that switches are widely used in many fields. They are used in all variety of large- and small-scale consumer products, including, but not limited to, automobiles and home electronics. They can be and are used as analog routers, gates, and relays. They are used as digital multiplexers, routers, and gates as well.

A number of prior-art transfer gates have been developed for digital and analog applications. Recent innovations have provided methods for operation at lower power supply potentials such as 3.3 Volts and 2.5 Volts, while providing some method of maintaining isolation when input values go beyond high- and low-potential power rail values. That is, when a transfer gate input potential exceeds the high-potential rail Vcc positively, or it exceeds the low-potential rail GND negatively. One such device that has been in relatively common use is shown in FIG. 1.

A complementary pair of transistors, NMOS transistor M1 and PMOS transistor M2 conduct signals between nodes A and B, where each of those nodes is couplable to an extended circuit. When a control signal OEN (shown in FIG. 1 associated with node A as the input for purposes of illustration only, but which can also be associated with node B as the input) is a logic "high" or "1," transistor M1 is turned on, and as a result of the inversion produced by inverter I1, transistor M2 is also on. In this condition, the two transistors are "on" and the potential at node B is essentially the same as the potential at node A. When OEN is at a logic "low" or "0," both transistors are off and there exists a high impedance for the transfer of any signal between nodes A and B. This is true for all potentials at node A or B that are less than the potential of high-potential power rail Vcc and greater than low-potential power rail GND. However, when either the input or the output node is greater than Vcc or less than GND, the potential associated with the typical logic low at the gate of transistor M1 and a typical logic high at the gate of M2 is insufficient to keep those transistors off. For a potential greater than Vcc, M2 will turn on, for a potential less than GND, M1 will turn on, irrespective of the logic level applied at input OEN. As a result, an overvoltage condition at either the input or the output will cause M1 and M2 to permit a signal to pass through that the OEN deems should be blocked. An undervoltage condition will likewise be passed under the same OEN condition.

For the purpose of this disclosure, the term "overvoltage" means the potential variation noted that occurs under static (DC) conditions as well as dynamic (AC) conditions. For that reason, overvoltage may be used interchangeably with overshoot. Passage of an overvoltage between nodes A and B when the signal at OEN requires the switch to be off is undesirable in that it will cause the passage of electric signals between the two nodes when none should be passed. This can disrupt the bus.

A device designed to resolve at least one portion of the problems associated with the complementary transfer gate of FIG. 1 is shown in FIG. 2. The device involves removal of NMOS transistor M1, leaving PMOS transistor M2 coupled between nodes A and B, where node A is the input from, or output to, a first extended circuit, and node B is the input from, or output to, a second extended circuit. As before, control node OEN is designed to control enablement of M2. In operation, a logic level HIGH from OEN through inverter IV1 to the gate of M2 turns M2 on and thereby permits a signal to pass between nodes A and B. A logic level LOW turns M2 off and blocks the transfer of the signal between A and B. Elimination of transistor M1 resolves the problem when the potential at node A or node B exceeds GND because that transistor is not there to be turned on. Unfortunately, that does not eliminate the possibility that the transfer gate will turn on when it should be off under conditions of positive voltage exceeding Vcc.

It would be desirable to have a transfer gate operating with a single PMOS transistor as the FET switch substantially as shown in the circuit of FIG. 2. Such a switch would have reasonable resistance and capacitance characteristics when compared to alternative solutions requiring additional switching components. However, the prior single PMOS switch of FIG. 2 is unacceptable during overvoltage conditions in that there is a parasitic diode connected between either the source or drain of the transistor and its bulk. As can be seen, the bulk of the transistor is tied to the high-potential power rail Vcc. During overvoltage conditions at the high-potential rail, the parasitic diode conducts current from Vcc to either the input node or the output node, depending upon which is at a potential that is higher than the potential of Vcc. Under that condition, current will move from the output node to the input node, thereby causing a disruption of signal transmission otherwise occurring at the output node. This can occur independent of the condition of the enable signal at OEN. Such a concern is of increasing importance as circuits having mixed power supplies are coupled together and the possibility of overvoltage becomes increasingly likely.

Two characteristics of the physical structure of the single PMOS FET switch cause this clearly undesirable parasitic conduction condition. The first is the formation of a parasitic bipolar PNP transistor. The second is the unintended turning on of the PMOS FET switch in certain overvoltage situations. With regard to the first condition, the drain (P-type collector), transistor bulk (N-type base), and source (P-type emitter) form the PNP transistor. Transistor fabrication steps currently in use in sub-micron processes can yield in this common-base parasitic bipolar transistor a current gain that is the equivalent of a common-emitter gain ($\beta$) of about 10. Thus, during an overvoltage condition, the relatively small current moving from the high-potential rail to the more positive input node yields a ten-fold increase in the undesired parasitic current moving from the output node to the input node. Of course, in an ideal FET switch there should be no current flowing from the output node to the input node unless specifically enabled.

The other undesirable condition associated with the parasitic diode of the prior single-FET switch relates to the undesired conduction by the FET switch during an overvoltage event. Specifically, if current is developed from the high-potential rail through a lower-potential circuit node there is a potential drop across the substrate/bulk resistance that will cause the transistor to conduct current from one circuit node to the other, even during sub-threshold conditions. That conduction is significant enough to cause leakage resulting in unintended signal switching in certain instances.

It may be seen that it is necessary to isolate the primary FET bulk from Vcc when the switch is disabled in order to prevent the parasitic PNP bipolar transistor condition. However, in order to address the second problem condition, it is necessary to keep the primary transistor's gate potential substantially the same as its bulk potential. Therefore, what is needed is a FET switch that resolves both problems. What is also needed is such a FET switch that offers less resistance and capacitance than prior switches. Yet further, what is needed is a FET switch that preferably takes up less chip space than prior switches.

SUMMARY OF THE INVENTION

It is an object of the present invention to provide a semiconductor circuit that acts as a switch for digital and analog operations. It is also an object of the present invention to provide a semiconductor switch that is a transfer gate or pass gate operable for a broad range of supply voltages, including supply voltages of less than five volts. It is a further object of the present invention to provide a transfer gate circuit that remains operable in the manner intended during overvoltage conditions. Included as part of that object is the goal to provide a FET switch that isolates the primary FET bulk from the circuits high-potential power rail when the switch is disabled in order to prevent a parasitic PNP bipolar transistor condition. A further goal is to keep the primary transistor's gate potential substantially the same as or higher than its bulk potential. Finally, it is an object to provide such an FET switch circuit with reduced resistance and capacitance characteristics and that optimizes the performance for the user.

These and other objectives are achieved in the present invention through the arrangement of a set of MOS transistors coupled together, to the high- and low-potential power rails, and to the input and output nodes of the circuit such that isolation, under control of the enable|disable signal, of a primary FET switch that is the input/output transfer device is achieved under all input/output voltage conditions. In summary, a single PMOS transistor of the prior art shown in FIG. 2 is used as the switch. Coupled to that single PMOS transistor are two potential arbiter sub-circuits that are used to define the potential of a pseudo high-potential power rail. The first arbiter sub-circuit regulates the potential of the bulk of the primary switch transistor in relation to the potential at a first (input or output) circuit node. The second arbiter circuit regulates the transistor's bulk potential in relation to the potential at a second (output or input) circuit node. The higher of the potentials associated with the two arbiter circuits is passed to the bulk of the primary switch transistor. The arbiter sub-circuits are designed to ensure that the higher potential is passed to the pseudo high rail, regardless of whether electrical signal passage is from node A to node B or node B to node A. Thus, the bulk of the primary switch or transfer transistor of the present invention will always be at the highest potential possible and therefore will not develop either of the parasitic conduction conditions described.

The circuit of the present invention further includes an enable control circuit designed to link the gate of the transfer transistor to the enable signal in a way that ensures complete operational capability of the bus switch under all conditions. In particular, the controller circuit preferably is an inverter having its output coupled to the transfer transistor's gate, and a high-potential node that is coupled to the pseudo high-potential rail. The circuit of the present invention further includes a branch for coupling the pseudo high-potential rail to the standard high-potential rail when there is no overvoltage event on either of the input/output nodes.

The overvoltage tolerant switch circuit conducts as required when it is enabled, regardless of overvoltage events. Further, it does not conduct, nor does it leak current to the high-potential rail, when the switch is disabled and there is an overvoltage event on either node. Finally, it operates as desired when there are no overvoltage condition exists.

These and other advantages of the present invention will become apparent upon review of the following detailed description of the embodiments of the invention, the accompanying drawings, and the appended claims.

DETAILED DESCRIPTION OF THE PREFERRED EMBODIMENT OF THE INVENTION

Figure 3:
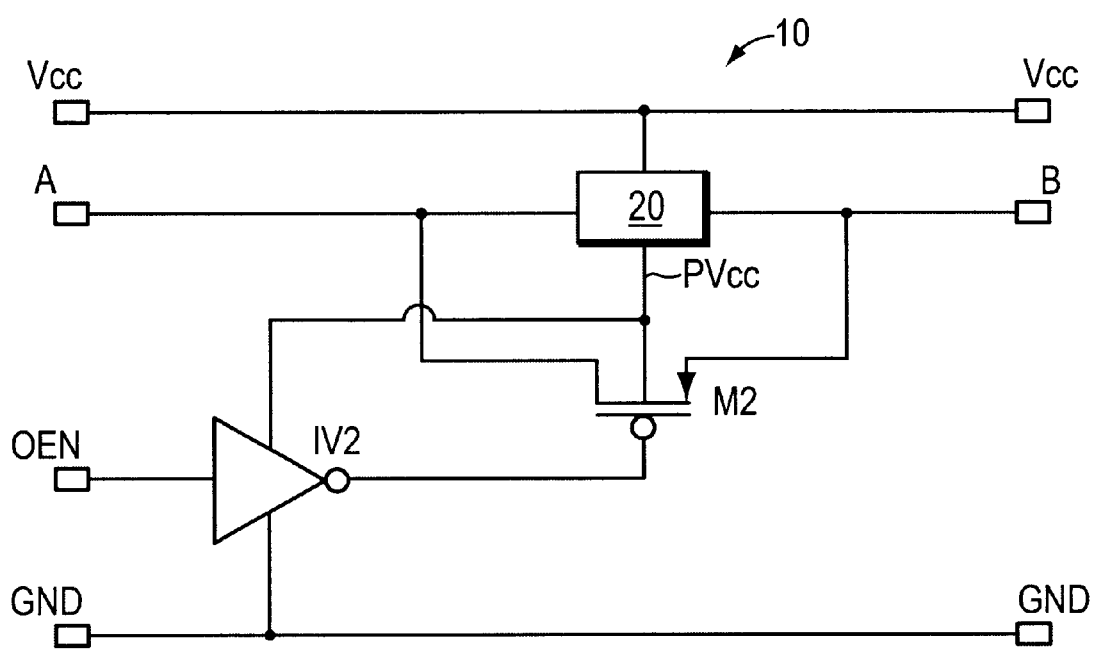
FIG. 3 is a schematic block diagram of the overvoltage tolerant FET switch circuit of the present invention, showing the PMOS transfer transistor in combination with an arbitration circuit as the primary transfer components of a bus FET switch that is couplable to extended circuitry.

An overvoltage-tolerant bus switch 10 of the present invention is shown in FIG. 3. The switch 10 includes an arbitration circuit 20 powered by high-potential power rail Vcc, a pseudo high-potential rail PVcc, and transfer transistor M2. An enable controller that is inverter IV2 is supplied by low-potential power rail GND and by PVcc. IV2 is used to define a selectable signal to activate the transfer transistor M2. An enable signal coming from a control circuit (not shown) by output enable node OEN is preferably coupled to the gate of M2 through IV2. Transistor M2 is the primary regulator of the transfer of a signal between nodes A and B. It is a P-type MOS transistor formed with an isolated N-type well. Either of node A or node B may be an input node or an output node, dependent upon the direction of the signal passing between the external circuitry coupled to those two nodes.

In order to take full advantage of the use of a single transfer transistor in the bus switch 10 without the disadvantages associated with the prior-art switch of FIG. 3, the bulk of M2 is coupled to the pseudo high-potential rail PVcc. Arbitration circuit 20 defines the potential of PVcc as always being the higher of the potential at node A, node B, or Vcc. It is to be noted that the circuit is designed such that the bulk of M2 is "protected" regardless of whether overvoltage is experienced at node A or node B. Specifically, the arbitration circuit 20 is coupled to nodes A and B and Vcc with means to select the higher potential associated with those three references to transmit to the bulk of M2. The arbitration circuit 20 senses node A, node B, and Vcc to drive the pseudo high-potential power rail PVcc to the higher of the potential at node A, node B, or Vcc.

The circuit 10 shown in FIG.3 blocks parasitic conduction caused by the bipolar effect of transistor M2 through the connection of the bulk of M2 to PVcc and the arrangement of circuit 20. Conduction would otherwise occur during overvoltage events occurring at both node A and node B. However, since the bulk of M2 will be at the highest potential of either node, and therefore higher than the potential at Vcc during the overvoltage event, there is insufficient potential to cause a turning on of that device. The circuit 10 is also designed to prevent the parasitic conduction that can otherwise occur when field effect potential is sufficient within M2 to cause a gate to bulk potential exceeding Vt. In particular, this is accomplished by referencing the inverter IV2 to PVcc rather then to Vcc. The inverter IV2 is powered in that way and coupled to the gate of M2 such that when M2 is supposed to be disabled, its gate is coupled to its bulk, ensuring that it cannot be turned on.

Figure 4:
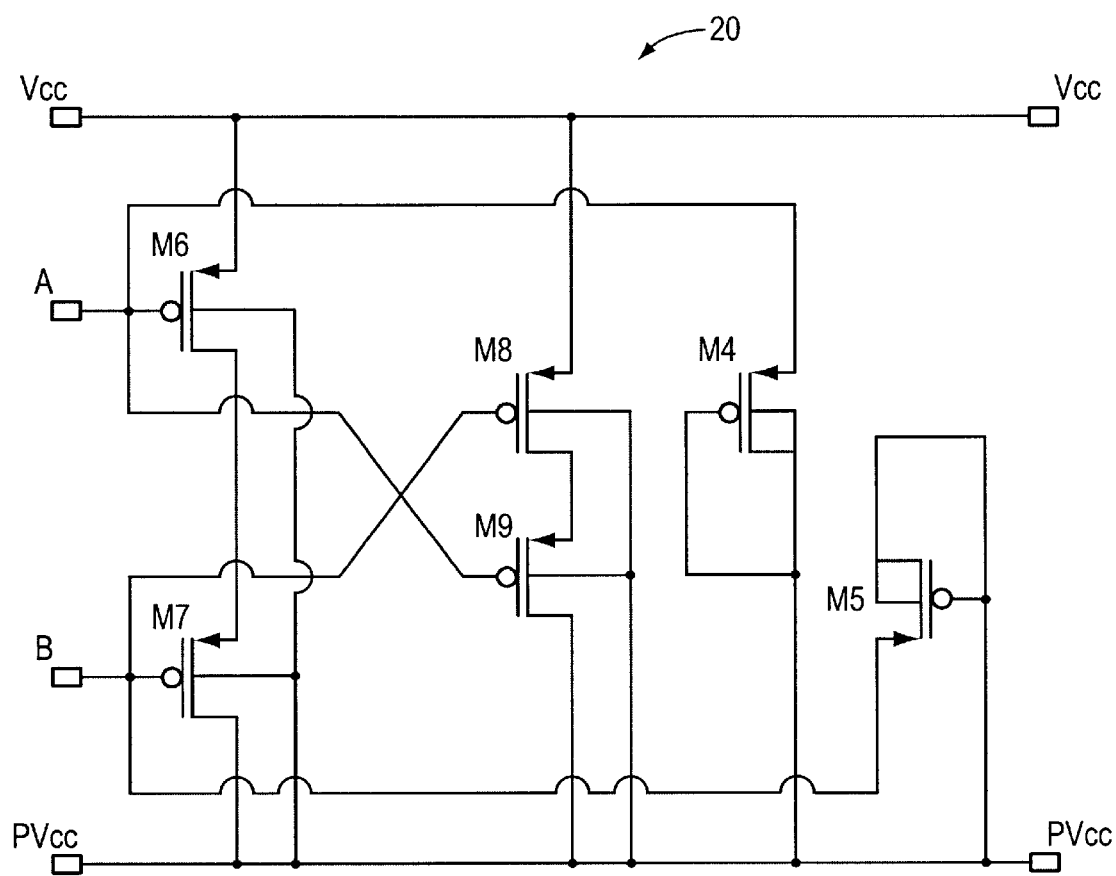
FIG. 4 is a detailed schematic diagram of the overvoltage tolerant FET switch circuit of the present invention.

The arbitration circuit 20 is preferably configured as shown in FIG. 4. It includes first diode-wired arbitration transistor M3 and second diode-wired arbitration transistor M4 each having their respective drains, gates, and bulks coupled to PVcc. However, the source of M4 is coupled to node A and the source of M5 is coupled to node B. Although two diode-wired PMOS transistors are shown in FIG. 4, it is to be understood that alternative diode means may be substituted therefore including, but not limited to, any P-N junction, such as a diode, a diode-wired NMOS transistor, or a diode-wired bipolar transistor.

The arbitration circuit 20 further includes a first clamping branch and a second clamping branch to prevent floating of the circuit 10 when neither node A nor node B is at a logic HIGH. Instead, those two branches ensure that PVcc is tied to Vcc in that situation. The first clamping branch includes transistors M6 and M7 in series. The gate of transistor M6 is coupled to node A, its source is coupled to Vcc, its drain is coupled to the source of M7 and its bulk is coupled to PVcc. Transistor M7 has its gate coupled to node B, its source coupled to the drain of M6, and its drain and bulk coupled to PVcc. The second clamping branch includes transistors M8 and M9 in series. The gate of transistor M8 is coupled to node B, its source is coupled to Vcc, its drain is coupled to the source of M9 and its bulk is coupled to PVcc. Transistor M9 has its gate coupled to node A, its source coupled to the drain of M8, and its drain and bulk coupled to PVcc. It is to be understood that alternative logic means may be employed to couple PVcc to Vcc when circuit 10 is to pass a logic LOW signal between nodes A and B.

Figure 1:
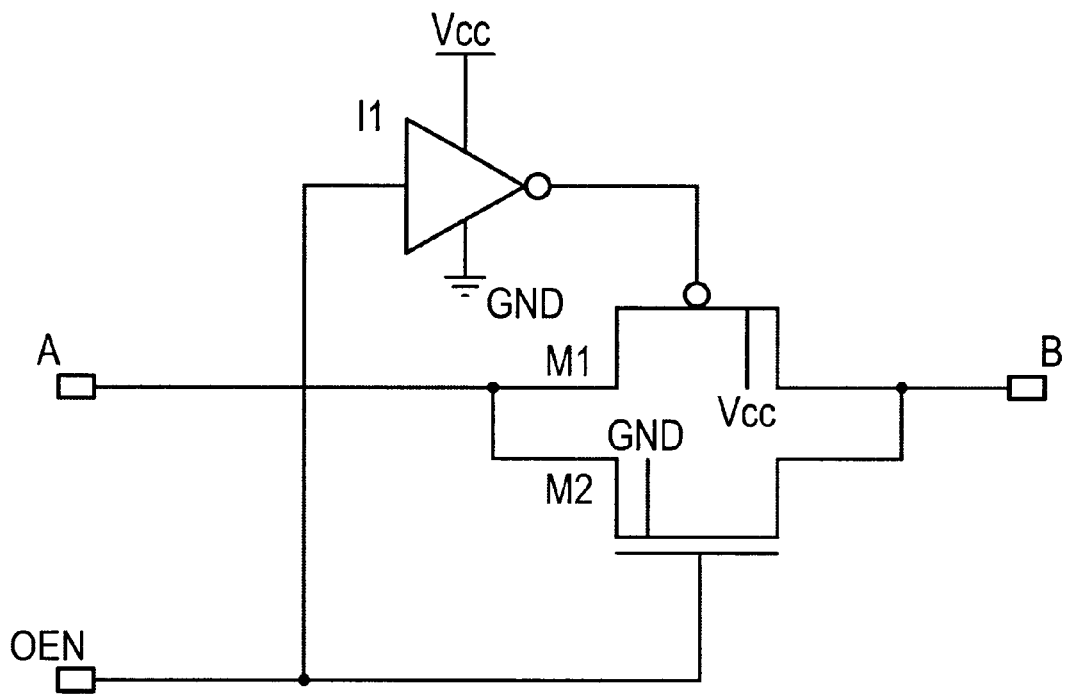
FIG. 1 is a simplified schematic diagram of a prior-art transfer gate having a CMOS transistor pair as the primary transfer element of the transfer device.
Figure 2:
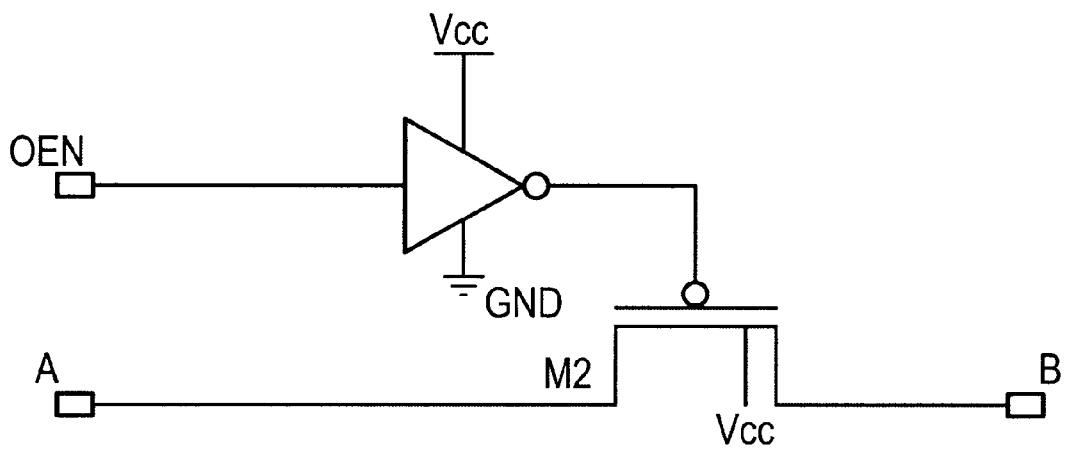
FIG. 2 is a simplified schematic diagram of a prior-art transfer gate having a single enhancement-mode PMOS transistor as the transfer device.
Figure 5:
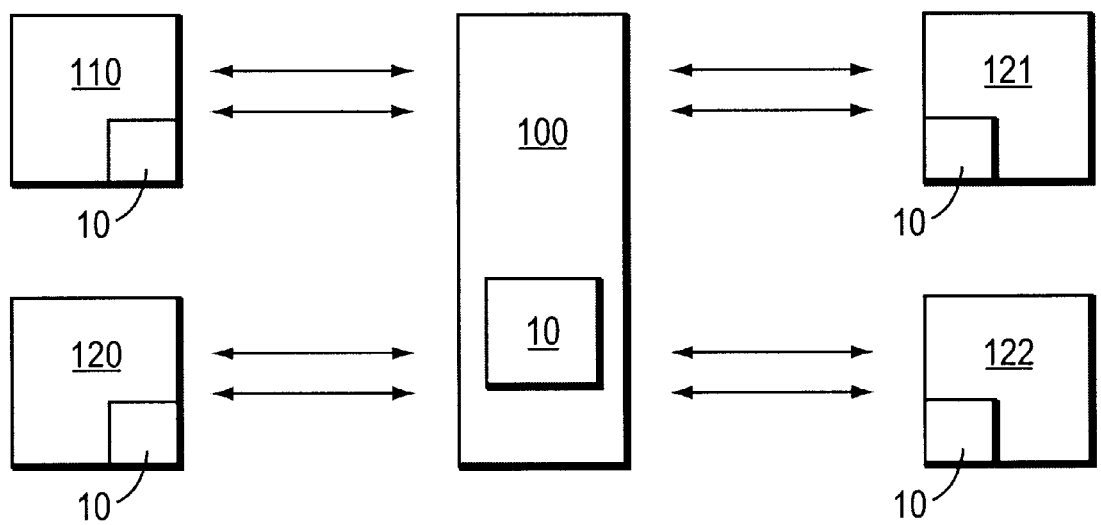
FIG. 5 is a simplified block diagram representation showing the application of the present invention in context.

FIG. 5 illustrates in a simplified way the circuit10 of the present invention in context. A common bus 100 is used in any computer processing system to transfer signals among discrete external or internal devices. Such devices include, but are not limited to, a central processing unit 110 and peripherals 120–122, that may be any sort of device, such as a printer, external or internal memory, remote wireless cellular phone, or the like. Any one or more of components 100, 110, 120–122 may include circuit 10 as a bus switch circuit to prevent undesirable effects caused by overvoltage events transferring from one devices to another, or even within devices. Further, circuit 20 may be employed to protect against overvoltage when the transfer transistor is a lone PMOS transistor or in alternative switch circuits in which a PMOS transistor is employed to pass electrical signals including but not limited to, for example, the PMOS transistor of the pass gate of the prior art shown in FIG. 1.

While the present invention has been described with specific reference to particular embodiments, it is to be understood that all modifications, variants, and equivalents are deemed to be within the scope of the following appended claims.

What is claimed is:

1. An overvoltage tolerant bus switch for regulating the transfer of a logic signal between a first node and a second node, wherein the logic signal may be transferred from the first node to the second or from the second node to the first, the bus switch powered by a high-potential power rail and a low-potential power rail, the bus switch activated by an enable signal at an enable signal node, the bus switch comprising:
   a. a MOS transfer transistor having a gate coupled to the enable signal node, a source coupled to the first node, and a drain coupled to the second node;
   b. an arbitration circuit having a first input coupled to the first node, a second input coupled to the second node, a third input coupled to the high-potential power rail, said arbitration circuit having an output; and
   c. a pseudo high-potential power rail coupled to said output of said arbitration circuit and to a bulk region of said transfer transistor, wherein said arbitration circuit supplies said pseudo high-potential power rail a potential that is the highest of the potentials associated with the first node, the second node, and the high-potential power rail.

2. The bus switch as claimed in claim 1 wherein said MOS transfer transistor is a PMOS transistor.

3. The bus switch as claimed in claim 2 further comprising a controller circuit having an input coupled to the enable signal node and an output coupled to said gate of said PMOS transfer transistor.

4. The bus switch as claimed in claim 3 wherein said controller circuit is an inverter including a PMOS transistor having a gate coupled to the enable signal node, a source coupled to said pseudo high-potential power rail, and a drain coupled to said gate of said transfer transistor, and an NMOS transistor having a gate coupled to the enable signal node, a drain coupled to said gate of said transfer transistor, and a source coupled to the low-potential power rail.

5. The bus switch as claimed in claim 1 wherein said arbitration circuit includes:
   a. a first diode means having a high-potential node coupled to the first node and a low-potential node coupled to said pseudo high-potential power rail; and
   b. a second diode means having a high-potential node coupled to the second node and a low-potential node coupled to said pseudo high-potential power rail.

6. The bus switch as claimed in claim 5 wherein said first diode means is a diode-wired PMOS transistor having a source coupled to the first node and a gate and a drain coupled to said pseudo high-potential power rail, and wherein said second diode means is a second diode-wired PMOS transistor having a source coupled to the second node and a gate and a drain coupled to said pseudo high-potential power rail.

7. The bus switch as claimed in claim 5 wherein said arbitration circuit further includes a first clamping branch and a second clamping branch coupled between the high-potential power rail and said pseudo high-potential power rail.

8. The bus switch as claimed in claim 7 wherein said first clamping branch includes:
   a. a first PMOS transistor having a gate coupled to the first node and a source coupled to the high-potential power rail; and
   b. a second PMOS transistor having a gate coupled to the second node, a drain coupled to said pseudo high-potential power rail, and a source coupled to a drain of said first PMOS transistor.

9. The bus switch as claimed in claim 8 wherein said second clamping branch includes:
   a. a third PMOS transistor having a gate coupled to the second node and a source coupled to the high-potential power rail; and
   b. a fourth PMOS transistor having a gate coupled to the first node, a drain coupled to said pseudo high-potential power rail, and a source coupled to a drain of said third PMOS transistor.

10. A method of propagating an electrical signal corresponding to a logic HIGH between a first node and a second node associated with a MOS transfer transistor switch having a source coupled to either of the first and second nodes and a drain coupled to the other of the first and second nodes while preventing overvoltage events on either the first and second node from passing therebetween when the switch is supposed to be disabled, the method comprising the steps of:
   a. establishing a pseudo high-potential power rail, wherein a potential associated with said pseudo high-potential power rail is the highest of a potential associated with the first node, a potential associated with the second node, and a potential associated with a high-potential power rail; and
   b. coupling a bulk of the MOS transfer transistor to said pseudo high-potential power rail.

11. The method as claimed in claim 10 wherein the step of establishing said pseudo high-potential power rail includes the step of coupling an arbitration circuit to the first node, the second node, and the high-potential power rail and providing means for transferring the potential associated with the highest of those nodes to said pseudo high-potential power rail.

12. The method as claimed in claim 11 wherein said arbitration circuit includes a first diode means having a high-potential node coupled to the first node and a low-potential node coupled to said pseudo high-potential power rail, a second diode means having a high-potential node coupled to the second node and a low-potential node coupled to said pseudo high-potential node, and a clamping circuit having a high-potential node coupled to the high-potential power rail and a low-potential node coupled to said pseudo high-potential power rail.

13. The method as claimed in claim 12 wherein said first diode means is a diode-wired PMOS transistor having a source coupled to the first node and a drain and a gate coupled to said pseudo high-potential power rail.

14. The method as claimed in claim 13 wherein said second diode means is a diode-wired PMOS transistor having a source coupled to the second node and a drain and a gate coupled to said pseudo high-potential power rail.

15. The method as claimed in claim 10 wherein the MOS transfer transistor is a PMOS transistor.

16. A computer system including one or more devices requiring the propagation of one or more logic signals between a first node and a second node, the computer system comprising a bus switch including:
   a. a MOS transfer transistor having a gate coupled to an enable signal node, a source coupled to the first node, and a drain coupled to the second node;
   b. an arbitration circuit having a first input coupled to the first node, a second input coupled to the second node, a third input coupled to the high-potential power rail, said arbitration circuit having an output; and
   c. a pseudo high-potential power rail coupled to said output of said arbitration circuit and to a bulk region of said transfer transistor, wherein said arbitration circuit supplies said pseudo high-potential power rail a potential that is the highest of the potentials associated with the first node, the second node, and the high-potential power rail.

* * * * *